United States Patent
Branets et al.

(10) Patent No.: US 10,803,534 B2
(45) Date of Patent: Oct. 13, 2020

(54) HANDLING DOMAIN DISCONTINUITY WITH THE HELP OF GRID OPTIMIZATION TECHNIQUES

(71) Applicants: Larisa V. Branets, Conroe, TX (US); Xiaohui Wu, Sugar Land, TX (US); Linfeng Bi, Houston, TX (US)

(72) Inventors: Larisa V. Branets, Conroe, TX (US); Xiaohui Wu, Sugar Land, TX (US); Linfeng Bi, Houston, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 1001 days.

(21) Appl. No.: 14/868,562

(22) Filed: Sep. 29, 2015

(65) Prior Publication Data
US 2016/0125555 A1 May 5, 2016

Related U.S. Application Data

(60) Provisional application No. 62/081,159, filed on Nov. 18, 2014, provisional application No. 62/073,465, filed on Oct. 31, 2014.

(51) Int. Cl.
*G06Q 50/02* (2012.01)
*G06Q 10/06* (2012.01)
(Continued)

(52) U.S. Cl.
CPC .......... *G06Q 50/02* (2013.01); *G01V 99/005* (2013.01); *G06Q 10/067* (2013.01);
(Continued)

(58) Field of Classification Search
CPC .... G06Q 50/02; G06Q 10/067; G01V 99/005; G06T 17/205
See application file for complete search history.

(56) References Cited

U.S. PATENT DOCUMENTS

| 5,537,320 A | 7/1996 | Simpson et al. |
| 5,671,136 A | 9/1997 | Willhoit, Jr. |

(Continued)

FOREIGN PATENT DOCUMENTS

| EP | 1653411 | 10/2004 |
| EP | 1707993 | 3/2005 |

(Continued)

OTHER PUBLICATIONS

Desheng Wang et. al., Mesh Optimization Based on the Centroidal Voronoi Tessellation, International Journal of Numerical Analysis and Modeling, vol. 2, Supp, pp. 100-113, 2005.*

(Continued)

*Primary Examiner* — Justin C Mikowski
(74) *Attorney, Agent, or Firm* — ExxonMobil Upstream Research Company—Law Department

(57) ABSTRACT

Method for mapping a 3D grid or mesh from a faulted subsurface domain to a continuous design domain, wherein the grid may be used to represent a discrete model of a subsurface material property (such as permeability) to use, for example, in a reservoir simulator. The mapping is geometry-based, not physics-based. The mapping is determined by an iterative optimization procedure designed to penalize deformation of tessellated mesh cells (703) in the design domain compared to their geometric quality in the faulted domain (701), but subject to stitching constraints (702) appearing as a penalty term or Lagrange multiplier term in the optimization objective function to influence the final mesh to co-locate pairs of points identified on opposite sides of a fault as having been located together before the fault occurred.

10 Claims, 5 Drawing Sheets

(51) Int. Cl.
*G01V 99/00* (2009.01)
*G06T 17/20* (2006.01)
*G06F 30/20* (2020.01)

(52) U.S. Cl.
CPC ........ *G06T 17/205* (2013.01); *G01V 2210/66* (2013.01); *G06F 30/20* (2020.01)

(56) References Cited

U.S. PATENT DOCUMENTS

| | | |
|---|---|---|
| 5,706,194 A | 1/1998 | Neff et al. |
| 5,710,726 A | 1/1998 | Rowney et al. |
| 5,747,673 A | 5/1998 | Ungerer et al. |
| 5,838,634 A | 11/1998 | Jones et al. |
| 5,844,799 A | 12/1998 | Joseph et al. |
| 5,953,680 A | 9/1999 | Divies et al. |
| 5,992,519 A | 11/1999 | Ramakrishnan et al. |
| 6,018,498 A | 1/2000 | Neff et al. |
| 6,052,529 A | 4/2000 | Watts, III |
| 6,106,561 A | 8/2000 | Farmer |
| 6,128,577 A | 10/2000 | Assa et al. |
| 6,128,579 A | 10/2000 | McCormack et al. |
| 6,138,076 A | 10/2000 | Graf et al. |
| 6,230,101 B1 | 5/2001 | Wallis |
| 6,374,185 B1 | 4/2002 | Taner et al. |
| 6,480,790 B1 | 11/2002 | Calvert et al. |
| 6,549,854 B1 | 4/2003 | Malinverno et al. |
| 6,597,995 B1 | 7/2003 | Cornu et al. |
| 6,662,146 B1 | 12/2003 | Watts |
| 6,664,961 B2 | 12/2003 | Ray et al. |
| 6,823,296 B2 | 11/2004 | Rey-Fabret et al. |
| 6,823,297 B2 | 11/2004 | Jenny et al. |
| 6,826,483 B1 | 11/2004 | Anderson et al. |
| 6,826,520 B1 | 11/2004 | Khan et al. |
| 6,826,521 B1 | 11/2004 | Hess et al. |
| 6,839,632 B2 | 1/2005 | Grace |
| 6,901,391 B2 | 5/2005 | Storm, Jr. et al. |
| 6,940,507 B2 | 9/2005 | Repin et al. |
| 6,980,940 B1 | 12/2005 | Gurpinar et al. |
| 6,987,878 B2 | 1/2006 | Lees et al. |
| 7,043,367 B2 | 5/2006 | Granjeon |
| 7,069,149 B2 | 6/2006 | Goff et al. |
| 7,089,166 B2 | 8/2006 | Malthe-Sorenssen et al. |
| 7,096,122 B2 | 8/2006 | Han |
| 7,096,172 B2 | 8/2006 | Colvin et al. |
| 7,177,787 B2 | 2/2007 | Rey-Fabret et al. |
| 7,191,071 B2 | 3/2007 | Kfoury et al. |
| 7,254,091 B1 | 8/2007 | Gunning et al. |
| 7,277,796 B2 | 10/2007 | Kuchuk et al. |
| 7,280,952 B2 | 10/2007 | Butler et al. |
| 7,286,972 B2 | 10/2007 | Maker |
| 7,363,163 B2 | 4/2008 | Valec-Dupin et al. |
| 7,369,980 B2 | 5/2008 | Deffenbaugh et al. |
| 7,376,539 B2 | 5/2008 | Lecomte |
| 7,379,853 B2 | 5/2008 | Middya |
| 7,379,854 B2 | 5/2008 | Calvert et al. |
| 7,406,878 B2 | 8/2008 | Rieder et al. |
| 7,412,363 B2 | 8/2008 | Callegari |
| 7,415,401 B2 | 8/2008 | Calvert et al. |
| 7,424,415 B2 | 9/2008 | Vassilev |
| 7,433,786 B2 | 10/2008 | Adams |
| 7,451,066 B2 | 11/2008 | Edwards et al. |
| 7,467,044 B2 | 12/2008 | Tran et al. |
| 7,478,024 B2 | 1/2009 | Gurpinar et al. |
| 7,480,205 B2 | 1/2009 | Wei |
| 7,486,589 B2 | 2/2009 | Lee et al. |
| 7,516,056 B2 | 4/2009 | Wallis et al. |
| 7,523,024 B2 | 4/2009 | Endres et al. |
| 7,526,418 B2 | 4/2009 | Pita et al. |
| 7,539,625 B2 | 5/2009 | Klumpen et al. |
| 7,542,037 B2 | 6/2009 | Fremming |
| 7,546,229 B2 | 6/2009 | Jenny et al. |
| 7,548,840 B2 | 6/2009 | Saaf |
| 7,577,527 B2 | 8/2009 | Velasquez |
| 7,584,081 B2 | 9/2009 | Wen et al. |
| 7,596,056 B2 | 9/2009 | Keskes et al. |
| 7,596,480 B2 | 9/2009 | Fung et al. |
| 7,603,265 B2 | 10/2009 | Mainguy et al. |
| 7,606,691 B2 | 10/2009 | Calvert et al. |
| 7,617,082 B2 | 11/2009 | Childs et al. |
| 7,620,800 B2 | 11/2009 | Huppenthal et al. |
| 7,640,149 B2 | 12/2009 | Rowan et al. |
| 7,657,494 B2 | 2/2010 | Wilkinson et al. |
| 7,672,825 B2 | 3/2010 | Brouwer et al. |
| 7,684,929 B2 | 3/2010 | Prange et al. |
| 7,706,981 B2 | 4/2010 | Wilkinson et al. |
| 7,711,532 B2 | 5/2010 | Dulac et al. |
| 7,716,029 B2 | 5/2010 | Couet et al. |
| 7,771,532 B2 | 5/2010 | Dulac et al. |
| 7,739,089 B2 | 6/2010 | Gurpinar et al. |
| 7,752,023 B2 | 7/2010 | Middya |
| 7,756,694 B2 | 7/2010 | Graf et al. |
| 7,783,462 B2 | 8/2010 | Landis, Jr. et al. |
| 7,796,469 B2 | 9/2010 | Keskes et al. |
| 7,809,537 B2 | 10/2010 | Hemanthkumar et al. |
| 7,809,538 B2 | 10/2010 | Thomas |
| 7,822,554 B2 | 10/2010 | Zuo et al. |
| 7,830,744 B2 | 11/2010 | Wu et al. |
| 7,844,430 B2 | 11/2010 | Landis, Jr. et al. |
| 7,860,654 B2 | 12/2010 | Stone |
| 7,869,954 B2 | 1/2011 | Den Boer et al. |
| 7,877,246 B2 | 1/2011 | Moncorge et al. |
| 7,878,268 B2 | 2/2011 | Chapman et al. |
| 7,920,970 B2 | 4/2011 | Zuo et al. |
| 7,925,481 B2 | 4/2011 | Van Wagoner et al. |
| 7,932,904 B2 | 4/2011 | Branets et al. |
| 7,933,750 B2 | 4/2011 | Morton et al. |
| 7,953,585 B2 | 5/2011 | Gurpinar et al. |
| 7,970,593 B2 | 6/2011 | Roggero et al. |
| 7,986,319 B2 | 7/2011 | Dommisse |
| 7,991,660 B2 | 8/2011 | Callegari |
| 7,996,154 B2 | 8/2011 | Zuo et al. |
| 8,005,658 B2 | 8/2011 | Tilke et al. |
| 8,050,892 B2 | 11/2011 | Hartman |
| 8,078,437 B2 | 12/2011 | Wu et al. |
| 8,095,345 B2 | 1/2012 | Hoversten |
| 8,095,349 B2 | 1/2012 | Kelkar et al. |
| 8,145,464 B2 | 3/2012 | Arengaard et al. |
| 8,190,405 B2 | 5/2012 | Appleyard |
| 8,204,726 B2 | 6/2012 | Lee et al. |
| 8,204,727 B2 | 6/2012 | Dean et al. |
| 8,209,202 B2 | 6/2012 | Narayanan et al. |
| 8,212,814 B2 | 7/2012 | Branets et al. |
| 8,249,842 B2 | 8/2012 | Ghorayeb et al. |
| 8,255,195 B2 * | 8/2012 | Yogeswaren ........... E21B 49/00 702/6 |
| 8,271,248 B2 | 9/2012 | Pomerantz et al. |
| 8,275,589 B2 | 9/2012 | Montaron et al. |
| 8,275,593 B2 | 9/2012 | Zhao |
| 8,280,635 B2 | 10/2012 | Ella et al. |
| 8,280,709 B2 | 10/2012 | Koutsabeloulis et al. |
| 8,285,532 B2 | 10/2012 | Zangl et al. |
| 8,301,426 B2 | 10/2012 | Abasov et al. |
| 8,301,429 B2 | 10/2012 | Hajibeygi et al. |
| 8,315,845 B2 | 11/2012 | Lepage |
| 8,335,677 B2 | 12/2012 | Yeten et al. |
| 8,339,395 B2 | 12/2012 | Williams et al. |
| 8,350,851 B2 | 1/2013 | Flew et al. |
| 8,359,184 B2 | 1/2013 | Massonnat |
| 8,359,185 B2 | 1/2013 | Pita et al. |
| 8,374,974 B2 | 2/2013 | Chen et al. |
| 8,386,227 B2 | 2/2013 | Fung et al. |
| 8,401,832 B2 | 3/2013 | Ghorayeb et al. |
| 8,412,501 B2 | 4/2013 | Oury et al. |
| 8,412,502 B2 | 4/2013 | Moncorge et al. |
| 8,423,338 B2 | 4/2013 | Ding et al. |
| 8,428,919 B2 | 4/2013 | Parashkevov |
| 8,429,671 B2 | 4/2013 | Wood et al. |
| 8,433,551 B2 | 4/2013 | Fung et al. |
| 8,437,999 B2 | 5/2013 | Pita et al. |
| 8,447,525 B2 | 5/2013 | Pepper |
| 8,452,580 B2 | 5/2013 | Strebelle |
| 8,457,940 B2 | 6/2013 | Xi et al. |
| 8,463,586 B2 | 6/2013 | Mezghani et al. |
| 8,484,004 B2 | 7/2013 | Schottle et al. |

(56) References Cited

U.S. PATENT DOCUMENTS

| | | |
|---|---|---|
| 8,489,375 B2 | 7/2013 | Omeragic et al. |
| 8,494,828 B2 | 7/2013 | Wu et al. |
| 8,498,852 B2 | 7/2013 | Xu et al. |
| 8,510,242 B2 | 8/2013 | Al-Fattah |
| 8,515,678 B2 | 8/2013 | Pepper et al. |
| 8,515,720 B2 | 8/2013 | Koutsabeloulis et al. |
| 8,515,721 B2 | 8/2013 | Morton et al. |
| 8,521,496 B2 | 8/2013 | Schottle et al. |
| 8,504,341 B2 | 9/2013 | Cullick et al. |
| 8,532,967 B2 | 9/2013 | Torrens et al. |
| 8,532,969 B2 | 9/2013 | Li et al. |
| 8,543,364 B2 | 9/2013 | Liu et al. |
| 8,577,660 B2 | 11/2013 | Wendt et al. |
| 8,583,411 B2 | 11/2013 | Fung |
| 8,589,135 B2 | 11/2013 | Middya et al. |
| 8,599,643 B2 | 12/2013 | Pepper et al. |
| 8,606,524 B2 | 12/2013 | Soliman et al. |
| 8,612,194 B2 | 12/2013 | Horne et al. |
| 8,630,831 B2 | 1/2014 | Bratvedt et al. |
| 8,635,026 B2 | 1/2014 | Ameen |
| 8,639,444 B2 | 1/2014 | Pepper et al. |
| 8,655,632 B2 | 2/2014 | Moguchaya |
| 8,674,984 B2 | 3/2014 | Ran et al. |
| 8,676,557 B2 | 3/2014 | Ding et al. |
| 8,686,996 B2 | 4/2014 | Cheung et al. |
| 8,688,424 B2 | 4/2014 | Bourbiaux et al. |
| 8,694,261 B1 | 4/2014 | Robinson |
| 8,700,549 B2 | 4/2014 | Hossain et al. |
| 8,711,140 B1 | 4/2014 | Mallet |
| 8,712,746 B2 | 4/2014 | Tillier et al. |
| 8,712,747 B2 | 4/2014 | Cullick et al. |
| 8,718,958 B2 | 5/2014 | Breton et al. |
| 8,718,993 B2 | 5/2014 | Klie |
| 8,731,887 B2 | 5/2014 | Hilliard et al. |
| 8,731,891 B2 | 5/2014 | Sung et al. |
| 8,738,294 B2 | 5/2014 | Ameen |
| 8,743,115 B1 | 6/2014 | Mallet et al. |
| 8,762,442 B2 | 6/2014 | Jeong et al. |
| 8,775,141 B2 | 7/2014 | Raphael |
| 8,775,144 B2 | 7/2014 | Han et al. |
| 8,776,895 B2 | 7/2014 | Li et al. |
| 8,780,671 B2 | 7/2014 | Sayers |
| 8,793,111 B2 | 7/2014 | Tilke et al. |
| 8,797,319 B2 | 8/2014 | Lin |
| 8,798,974 B1 | 8/2014 | Nunns |
| 8,798,977 B2 | 8/2014 | Hajibeygi et al. |
| 8,803,878 B2 | 8/2014 | Andersen et al. |
| 8,805,660 B2 | 8/2014 | Güyagüler et al. |
| 8,812,334 B2 | 8/2014 | Givens et al. |
| 8,818,778 B2 | 8/2014 | Salazar-Tio et al. |
| 8,818,780 B2 | 8/2014 | Calvert et al. |
| 8,843,353 B2 | 9/2014 | Posamentier et al. |
| 8,855,986 B2 | 10/2014 | Castellini et al. |
| 8,855,987 B2 * | 10/2014 | Imhof ............... G01V 11/00 703/10 |
| 8,862,450 B2 | 10/2014 | Derfoul et al. |
| 8,874,804 B2 | 10/2014 | AlShaikh et al. |
| 8,898,017 B2 | 11/2014 | Kragas et al. |
| 8,903,694 B2 | 12/2014 | Wallis et al. |
| 8,935,141 B2 | 1/2015 | Ran et al. |
| 9,134,454 B2 * | 9/2015 | Mishev ............ G06F 17/5018 |
| 9,536,022 B1 * | 1/2017 | Tertois ............. G01V 99/005 |
| 9,626,466 B2 * | 4/2017 | Yang ............... G01V 99/005 |
| 9,690,002 B2 * | 6/2017 | Mallet ................ G01V 1/24 |
| 9,759,826 B2 * | 9/2017 | Mallet ............... G01V 1/302 |
| 2002/0049575 A1 | 4/2002 | Jalali et al. |
| 2003/0078758 A1 * | 4/2003 | Hariya ............ G06F 17/5018 703/2 |
| 2005/0027492 A1 * | 2/2005 | Taylor ................ G06K 9/48 703/2 |
| 2005/0171700 A1 | 8/2005 | Dean |
| 2006/0122780 A1 | 6/2006 | Cohen et al. |
| 2006/0253759 A1 * | 11/2006 | Wei .................. G01V 1/282 714/738 |
| 2006/0269139 A1 | 11/2006 | Keskes et al. |
| 2007/0016389 A1 | 1/2007 | Ozgen |
| 2007/0277115 A1 | 11/2007 | Glinsky et al. |
| 2007/0279429 A1 | 12/2007 | Ganzer et al. |
| 2008/0126168 A1 | 5/2008 | Carney et al. |
| 2008/0133550 A1 | 6/2008 | Orangi et al. |
| 2008/0144903 A1 | 6/2008 | Wang et al. |
| 2008/0234988 A1 | 9/2008 | Chen et al. |
| 2008/0306803 A1 | 12/2008 | Vaal et al. |
| 2009/0071239 A1 | 3/2009 | Rojas et al. |
| 2009/0122061 A1 | 5/2009 | Hammon, III |
| 2009/0248373 A1 | 10/2009 | Druskin et al. |
| 2010/0132450 A1 | 6/2010 | Pomerantz et al. |
| 2010/0138196 A1 | 6/2010 | Hui et al. |
| 2010/0161300 A1 | 6/2010 | Yeten et al. |
| 2010/0179797 A1 | 7/2010 | Cullick et al. |
| 2010/0185428 A1 | 7/2010 | Vink |
| 2010/0191516 A1 | 7/2010 | Benish et al. |
| 2010/0312535 A1 | 12/2010 | Chen et al. |
| 2010/0324873 A1 | 12/2010 | Cameron |
| 2011/0004447 A1 | 1/2011 | Hurley et al. |
| 2011/0015910 A1 | 1/2011 | Ran et al. |
| 2011/0054869 A1 | 3/2011 | Li et al. |
| 2011/0115787 A1 | 5/2011 | Kadlec |
| 2011/0161133 A1 | 6/2011 | Staveley et al. |
| 2011/0288831 A1 * | 11/2011 | Tan .................. G01V 1/282 703/2 |
| 2011/0310101 A1 * | 12/2011 | Prange ............... G01V 99/00 345/420 |
| 2012/0006560 A1 * | 1/2012 | Calvert ............... E21B 43/00 166/369 |
| 2012/0059640 A1 | 3/2012 | Roy et al. |
| 2012/0065951 A1 | 3/2012 | Roy et al. |
| 2012/0143577 A1 | 6/2012 | Szyndel et al. |
| 2012/0158389 A1 | 6/2012 | Wu et al. |
| 2012/0159124 A1 | 6/2012 | Hu et al. |
| 2012/0215512 A1 | 8/2012 | Sarma |
| 2012/0215513 A1 | 8/2012 | Branets et al. |
| 2012/0232799 A1 | 9/2012 | Zuo et al. |
| 2012/0232859 A1 | 9/2012 | Pomerantz et al. |
| 2012/0232861 A1 | 9/2012 | Lu et al. |
| 2012/0232865 A1 | 9/2012 | Maucec et al. |
| 2012/0265512 A1 | 10/2012 | Hu et al. |
| 2012/0271609 A1 | 10/2012 | Laake et al. |
| 2012/0296617 A1 | 11/2012 | Zuo et al. |
| 2013/0035913 A1 | 2/2013 | Mishev et al. |
| 2013/0041633 A1 | 2/2013 | Hoteit |
| 2013/0046524 A1 | 2/2013 | Gathogo et al. |
| 2013/0073268 A1 | 3/2013 | Abacioglu et al. |
| 2013/0085730 A1 | 4/2013 | Shaw et al. |
| 2013/0090907 A1 | 4/2013 | Maliassov |
| 2013/0096890 A1 | 4/2013 | Vanderheyden et al. |
| 2013/0096898 A1 | 4/2013 | Usadi et al. |
| 2013/0096899 A1 | 4/2013 | Usadi et al. |
| 2013/0096900 A1 | 4/2013 | Usadi et al. |
| 2013/0110484 A1 | 5/2013 | Hu et al. |
| 2013/0112406 A1 | 5/2013 | Zuo et al. |
| 2013/0116993 A1 | 5/2013 | Maliassov |
| 2013/0118736 A1 | 5/2013 | Usadi et al. |
| 2013/0124097 A1 | 5/2013 | Thorne |
| 2013/0124161 A1 | 5/2013 | Poudret et al. |
| 2013/0124173 A1 | 5/2013 | Lu et al. |
| 2013/0138412 A1 | 5/2013 | Shi et al. |
| 2013/0151159 A1 | 6/2013 | Pomerantz et al. |
| 2013/0166264 A1 | 6/2013 | Usadi et al. |
| 2013/0185033 A1 | 7/2013 | Tompkins et al. |
| 2013/0199789 A1 | 8/2013 | Liang et al. |
| 2013/0204922 A1 | 8/2013 | El-Bakry et al. |
| 2013/0211802 A1 | 8/2013 | Templeton-Barrett et al. |
| 2013/0231907 A1 | 9/2013 | Yang et al. |
| 2013/0231910 A1 | 9/2013 | Kumar et al. |
| 2013/0245949 A1 | 9/2013 | Abitrabi et al. |
| 2013/0246031 A1 | 9/2013 | Wu et al. |
| 2013/0289961 A1 | 10/2013 | Ray et al. |
| 2013/0304679 A1 | 11/2013 | Fleming et al. |
| 2013/0311151 A1 | 11/2013 | Plessix |
| 2013/0312481 A1 | 11/2013 | Pelletier et al. |
| 2013/0332125 A1 | 12/2013 | Suter et al. |
| 2013/0338985 A1 | 12/2013 | Garcia et al. |
| 2014/0012557 A1 | 1/2014 | Tarman et al. |

(56) References Cited

U.S. PATENT DOCUMENTS

| | | | |
|---|---|---|---|
| 2014/0166280 A1 | 6/2014 | Stone et al. | |
| 2014/0201450 A1 | 7/2014 | Haugen | |
| 2014/0214388 A1 | 7/2014 | Gorell | |
| 2014/0236558 A1 | 8/2014 | Maliassov | |
| 2015/0120199 A1 | 4/2015 | Casey | |
| 2015/0294502 A1* | 10/2015 | Bonner | G06T 17/20 345/420 |
| 2016/0035130 A1 | 2/2016 | Branets et al. | |
| 2016/0041279 A1 | 2/2016 | Casey | |
| 2016/0124113 A1 | 5/2016 | Bi et al. | |
| 2016/0124117 A1 | 5/2016 | Huang et al. | |

FOREIGN PATENT DOCUMENTS

| | | |
|---|---|---|
| EP | 2 778 724 A2 | 9/2014 |
| EP | 2014/185950 | 11/2014 |
| WO | 1999/028767 | 6/1999 |
| WO | 2007/022289 | 2/2007 |
| WO | 2007/116008 | 10/2007 |
| WO | 2008/008121 | 1/2008 |
| WO | 2009/138290 | 11/2009 |
| WO | 2013/180709 | 12/2013 |
| WO | 2013/184190 | 12/2013 |
| WO | 2013/187915 | 12/2013 |
| WO | 2014/027196 | 2/2014 |
| WO | 2014/051903 | 4/2014 |
| WO | 2014/171947 | 10/2014 |
| WO | 2014/185898 | 11/2014 |

OTHER PUBLICATIONS

Fitsum Admasu et. al., Automatic Method for Correlating Horizons across Faults in 3D Seismic Data, Proceedings of the 2004 IEEE Computer Society Conference on Computer Vision and Pattern Recognition (CVPR'04).*
Moyen, R., et al., "3D-Parameterization of the 3D Geological Space—The Geochron Model," European Conf. on the Mathematics of Oil Recovery, Cannes, France, 8 pgs. (Aug. 30-Sep. 2, 2004).
U.S. Appl. No. 62/081,159, filed Nov. 18, 2014, Branets, et al.
U.S. Appl. No. 62/073,465, filed Oct. 31, 2014, Bi, et al.
U.S. Appl. No. 62/033,529, filed Aug. 5, 2014, Casey.
U.S. Appl. No. 62/031,097, filed Jul. 30, 2014, Branets, et al.
2D Kinematic Modelling (2014), "World-Leading Forward and Reverse Modelling Tools for Validating Your Interpretation and Reducing Uncertainty", www.mve.com, 2 pgs.
3D Kinematics Modelling (2014), "World-Leading 3D Forward and Reverse Modelling Tools to Help Validate Your Model, and Reduce Uncertainty", www.mve.com, 2 pgs.
Aarnes, J. (2004), "Multiscale simulation of flow in heterogeneous oil-reservoirs", SINTEF ICT, Dept. of Applied Mathematics, 2 pgs.
Aarnes, J. et al. (2004), "Toward reservoir simulation on geological grid models", $9^{th}$ European Conf. on the Mathematics of Oil Recovery, 8 pgs.
Ahmadizadeh, M., et al., (2007), "Combined Implicit or Explicit Integration Steps for Hybrid Simulation", Structural Engineering Research Frontiers, pp. 1-16.
Bortoli, L. J., et al., (1992), "Constraining Stochastic Images to Seismic Data", Geostatistics, Troia, Quantitative Geology and Geostatistics 1, pp. 325-338.
Byer, T.J., et al., (1998), "Preconditioned Newton Methods for Fully Coupled Reservoir and Surface Facility Models", SPE 49001, 1998 SPE Annual Tech. Conf., and Exh., pp. 181-188.
Candes, E. J., et al., (2004), "New Tight Frames of Curvelets and Optimal Representations of Objects with $C^2$ Singularities," Communications on Pure and Applied Mathematics 57, pp. 219-266.
Chen, Y. et al. (2003), "A coupled local-global upscaling approach for simulating flow in highly heterogeneous formations", Advances in Water Resources 26, pp. 1041-1060.
Connolly, P., (1999), "Elastic Impedance," The Leading Edge 18, pp. 438-452.
Crotti, M.A. (2003), "Upscaling of Relative Permeability Curves for Reservoir Simulation: An Extension to Areal Simulations Based on Realistic Average Water Saturations", SPE 81038, SPE Latin American and Caribbean Petroleum Engineering Conf., 6 pgs.
Donoho, D. L., Hou, X., (2002), "Beamlets and Multiscale Image Analysis," Multiscale and Multiresolution Methods, Lecture Notes in Computational Science and Engineering 20, pp. 149-196.
Durlofsky, L.J. (1991), "Numerical Calculation of Equivalent Grid Block Permeability Tensors for Heterogeneous Porous Media", Water Resources Research 27(5), pp. 699-708.
Farmer, C.L. (2002), "Upscaling: a review", Int'l. Journal for Numerical Methods in Fluids 40, pp. 63-78.
Gai, X., et al., (2005), "A Timestepping Scheme for Coupled Reservoir Flow and Geomechanics in Nonmatching Grids", SPE 97054, 2005 SPE Annual Tech. Conf. and Exh., pp. 1-11.
Haas, A., et al., (1994), "Geostatistical Inversion—A Sequential Method of Stochastic Reservoir Modeling Constrained by Seismic Data," First Break 12, pp. 61-569.
Haugen, K. B., et al., (2013), "Highly Optimized Phase Equilibrium Calculations", SPE 163583, pp. 1-9.
Holden, L. et al. (1992), "A Tensor Estimator for the Homogenization of Absolute Permeability", Transport in Porous Media 8, pp. 37-46.
Isaaks, E. H., et al., (1989), "Applied Geostatistics", Oxford University Press, New York, pp. 40-65.
Kurzak, J., et al., (2007), "Implementation of Mixed Precision in Solving Systems of Linear Equations on the Cell Processor", Concurrency Computat.: Pract. Exper. 2007, vol. 19, pp. 1371-1385.
Journel, A., (1992), "Geostatistics: Roadblocks and Challenges," Geostatistics, Troia '92: Quanititative Geoglogy and Geostatistics 1, pp. 213-224.
Klie, H., et al., (2005), "Krylov-Secant Methods for Accelerating the Solution of Fully Implicit Formulations", SPE 92863, 2005 SPE Reservoir Simulation Symposium, 9 pgs.
Mallat, S., (1999), "A Wavelet Tour of Signal Processing", Academic Press, San Diego, pp. 80-91.
Lu, B., et al., (2007), "Iteratively Coupled Reservoir Simulation for Multiphase Flow", SPE 110114, 2007 SPE Annual Tech. Conf. and Exh., pp. 1-9.
Mosqueda, G., et al., (2007), "Combined Implicit or Explicit Integration Steps for Hybrid Simulation", Earthquake Engng. & Struct. Dyn., vol. 36(15), pp. 2325-2343.
Strebelle, S., (2002), "Conditional simulations of complex geological structures using multiple-point statistics," Mathematical Geology 34(1), pp. 1-21.
Sweldens, W., (1998), "The Lifting Scheme: A Construction of Second Generation Wavelets," SIAM Journal on Mathematical Analysis 29, pp. 511-546.
Qi, D. et al. (2001), "An Improved Global Upscaling Approach for Reservoir Simulation", Petroleum Science and Technology 19(7 &8), pp. 779-795.
Verly, G., (1991), "Sequential Gaussian Simulation: A Monte Carlo Approach for Generating Models of Porosity and Permeability," Special Publication No. 3 of EAPG—Florence 1991 Conference, Ed.: Spencer, A.M, pp. 345-356.
Whitcombe, D. N., et al., (2002), "Extended elastic impedance for fluid and lithology prediction," Geophysics 67, pp. 63-67.
White, C.D. et al. (1987), "Computing Absolute Transmissibility in the Presence of Fine-Scale Heterogeneity", SPE 16011, $9^{th}$ SPE Symposium in Reservoir Simulation, pp. 209-220.
Wu, X.H. et al. (2007), "Reservoir Modeling with Global Scaleup", SPE 105237, $15^{th}$ SPE Middle East Oil & Gas Show & Conf., 13 pgs.
Yao, T., et al., (2004), "Spectral Component Geologic Modeling: A New Technology for Integrating Seismic Information at the Correct Scale," Geostatistics Banff, Quantitative Geology & Geostatistics 14, pp. 23-33.
Younis, R.M., et al., (2009), "Adaptively-Localized-Continuation-Newton: Reservoir Simulation Nonlinear Solvers That Converge All the Time", SPE 119147, 2009 SPE Reservoir Simulation Symposium, pp. 1-21.

(56) References Cited

OTHER PUBLICATIONS

Zhang T., et al., (2006), "Filter-based classification of training image patterns for spatial Simulation," *Mathematical Geology* 38,pp. 63-80.

* cited by examiner

HANDLING DOMAIN DISCONTINUITY WITH THE HELP OF GRID OPTIMIZATION TECHNIQUES

CROSS-REFERENCE TO RELATED APPLICATION

This application claims the benefit of U.S. Provisional Patent Application 62/081,159 filed Nov. 18, 2014 entitled "HANDLING DOMAIN DISCONTINUITY WITH THE HELP OF GRID OPTIMIZATION TECHNIQUES" and of U.S. Provisional Patent Application 62/073,465 filed Oct. 31, 2014 entitled "METHODS TO HANDLE DISCONTINUITY IN CONSTRUCTING DESIGN SPACE USING MOVING LEAST SQUARES", the entirety of which are incorporated by reference herein.

FIELD OF THE INVENTION

This disclosure relates generally to the field of hydrocarbon operations, such as prospecting or reservoir management and, more particularly, to reservoir modeling and simulation. Specifically, the disclosure relates to a method for optimal construction of a conceptual three-dimensional (3D) grid that is adapted to a subsurface domain's discontinuities, where the grid may be used for reservoir simulation studies in reservoir exploration, development or production stages, as well as for representing a geologic model description of a reservoir structure and material properties. More specifically, the grid can carry a model of material properties, such as rock and fluid properties, of a reservoir or can be used for numerical discretization of partial differential equations, such as fluid flow or wave propagation.

BACKGROUND

Consider the general problem of populating a complex n-dimensional (nD) domain with material properties where the domain is comprised of multiple separate nD pieces (volumes). A domain is a defined volume within a space. The pieces may come in partial contact with each other, thus, forming a non-manifold topology. The domain's material properties are described by a "designer" who can assign them to only one continuous volume at a time. To assist the designer's work, the original domain in the physical space can be mapped to a "design space" where all the separate volumes are pieced together based on some geometric criterion. The goal is to construct this mapping in such a way that volumetric pieces (e.g., compartments that are delineated by horizons and faults) are minimally deformed and the design space, while being a continuous volume, still preserves resemblance to the original domain, thus facilitating the designer's work of populating it with material properties.

For example, in geologic modeling of the subsurface, a 3D model domain is delineated by horizons and faults, where horizons are mostly flat horizontal surfaces related to deposition of sediment material forming a reservoir rock, and faults are discontinuities in the rock introduced by non-depositional events. The rock properties are usually described by the modeler in a continuous "depositional" space, while the physical space of the model may contain volume discontinuities in the form of post-depositional faults. Construction of design space corresponds to generation of a continuous region from a faulted structural framework by removing the fault throws.

U.S. Pat. No. 7,480,205 to Wei ("3D fast fault restoration") describes a method to solve geo-mechanical equations for a displacement field using a mesh that conforms to the horizons and faults in the framework. This is a complex, physics-based computation that is sensitive to the quality of the supporting mesh and can have performance (speed) limitations.

In U.S. Patent Application Publication No. 2008/0021684, a "parametric" mapping to design space is defined by solving a constrained optimization problem for three transfer functions u,v,t on a supporting 3D tetrahedral mesh that conforms to fault surfaces. Only tetrahedral mesh can be used, some of the constraints are heuristic and may be case-dependent, and special handling is required for erosional horizons.

Other conventional approaches, such as U.S. Pat. No. 6,106,561, are based on utilizing the ijk indexing system of the corner point grid built in the physical space for mapping to "simulation box" design space. Thus, generation of the mapping logic is combined with the logic for corner-point grid generation. Such kinds of mappings are very approximate and do not account for volume distortion of corner-point cells.

Accordingly, there remains a need in the industry for apparatus, methods, and systems that are more efficient and may be constructed to lessen problems with discontinuities associated with grid optimization techniques. The present techniques provide a method and apparatus that overcome one or more of the deficiencies discussed above.

SUMMARY

In one or more embodiments, a method for generating a model of a material property of a faulted subsurface region for hydrocarbon prospecting or reservoir development is described. The method comprising: generating, using a computer, a mapping of a model mesh representing a physical domain of the subsurface region, with faults, to an optimized mesh representing a continuous design space in which all faults are removed, said mapping being designed to minimize deformation in mesh cells; assigning values of the material property to continuous volumes in the optimized mesh to generate a model of the material property in the design space, and using that to generate a model of the material property in the faulted physical domain; and using the model of the material property in the faulted physical domain for hydrocarbon prospecting or reservoir development in the subsurface region.

BRIEF DESCRIPTION OF THE DRAWINGS

Due to patent law restrictions on the use of color.

Figure 1:
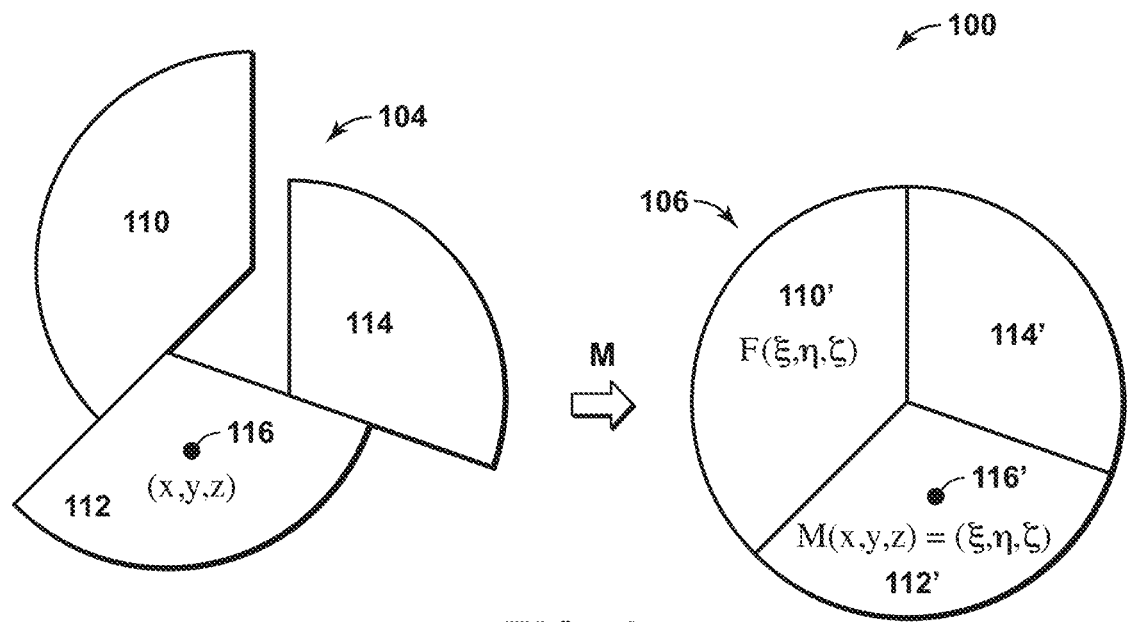
Figure 2:
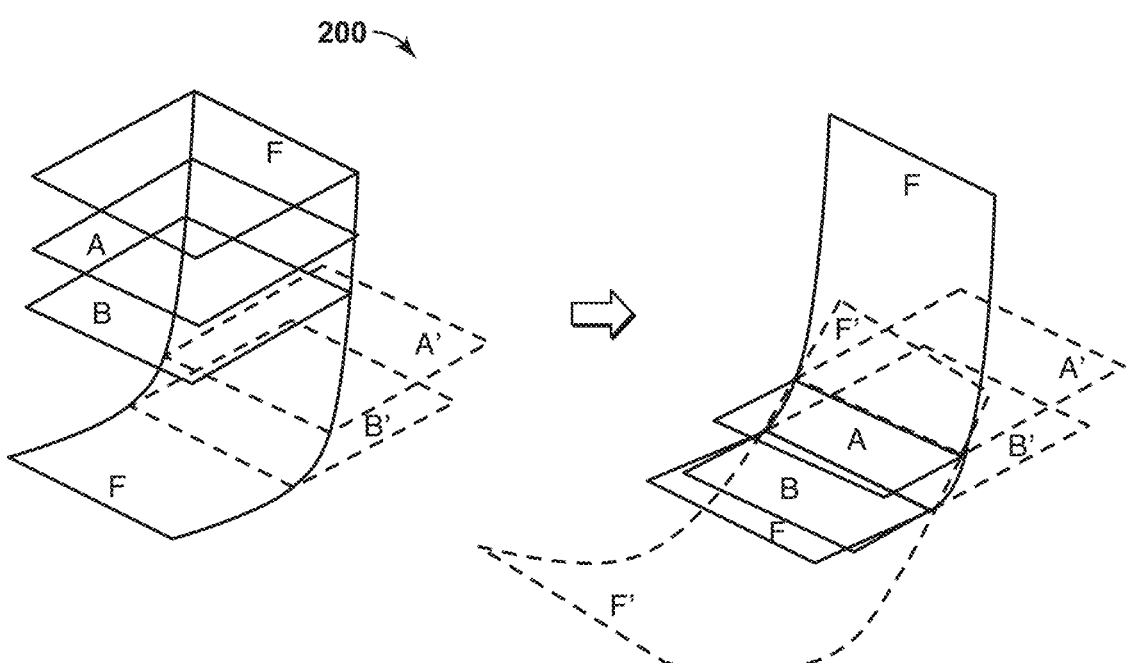
Figure 3A:
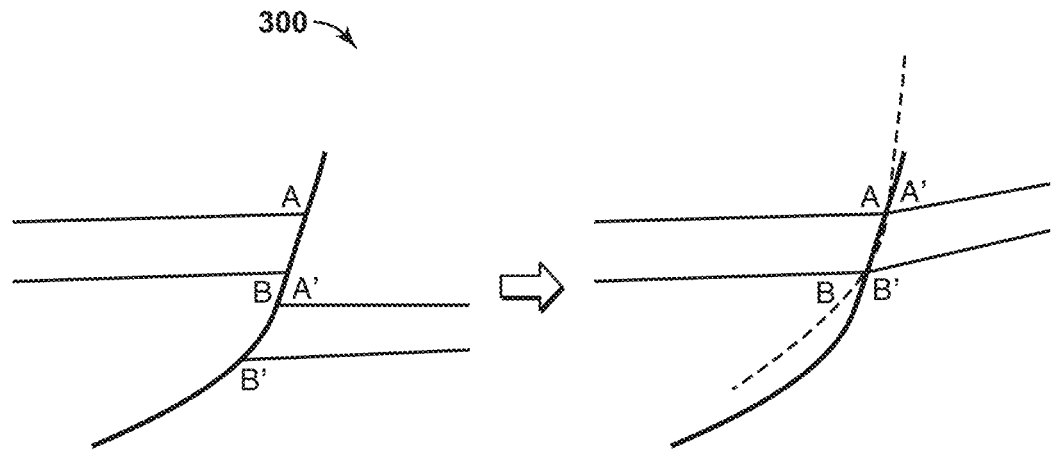
Figure 3B:
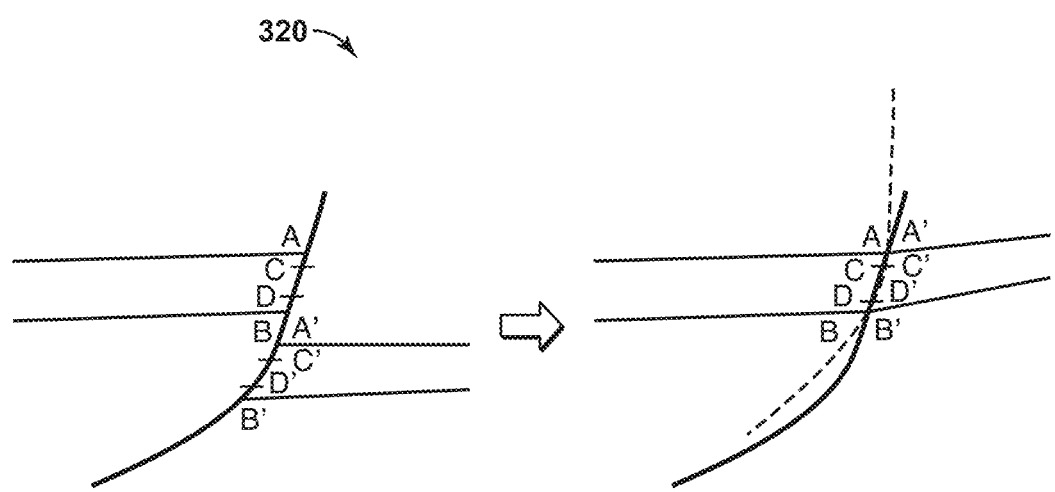
Figure 4:
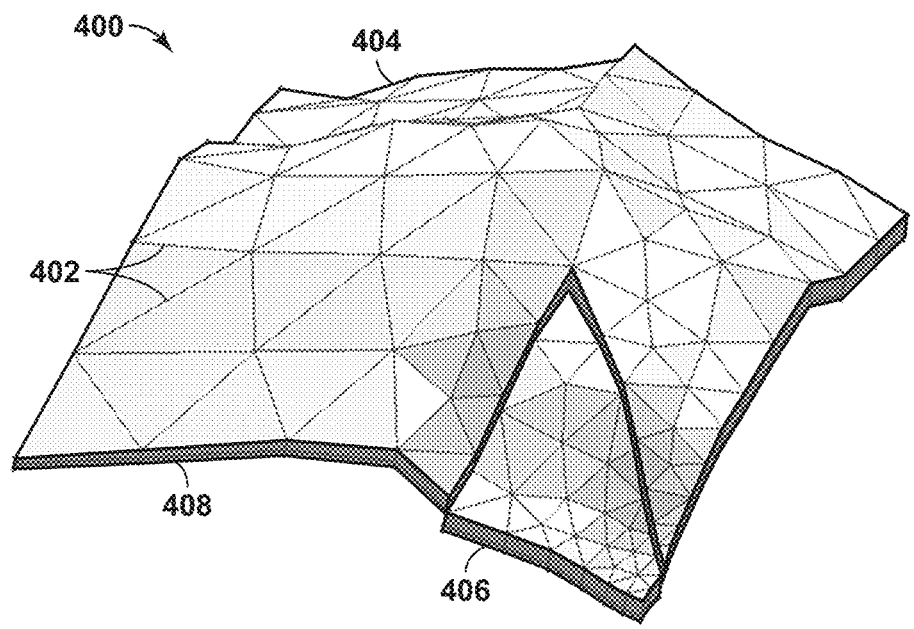
FIGS. 4, 5 and 6 are black-and-white reproductions of color drawings.
Figure 5:
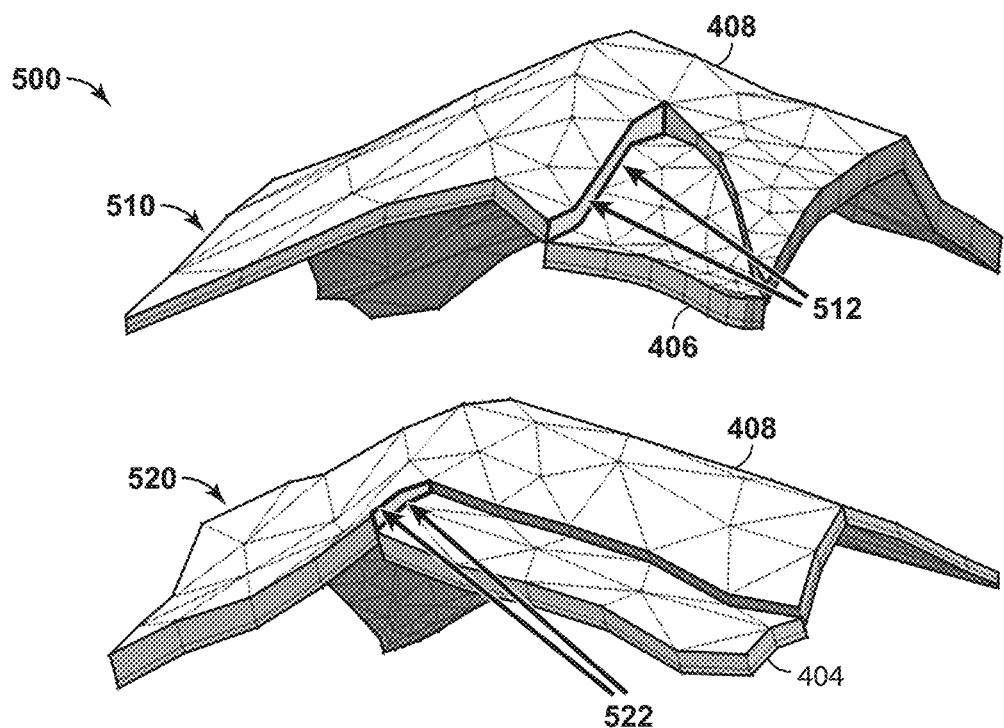
Figure 6:
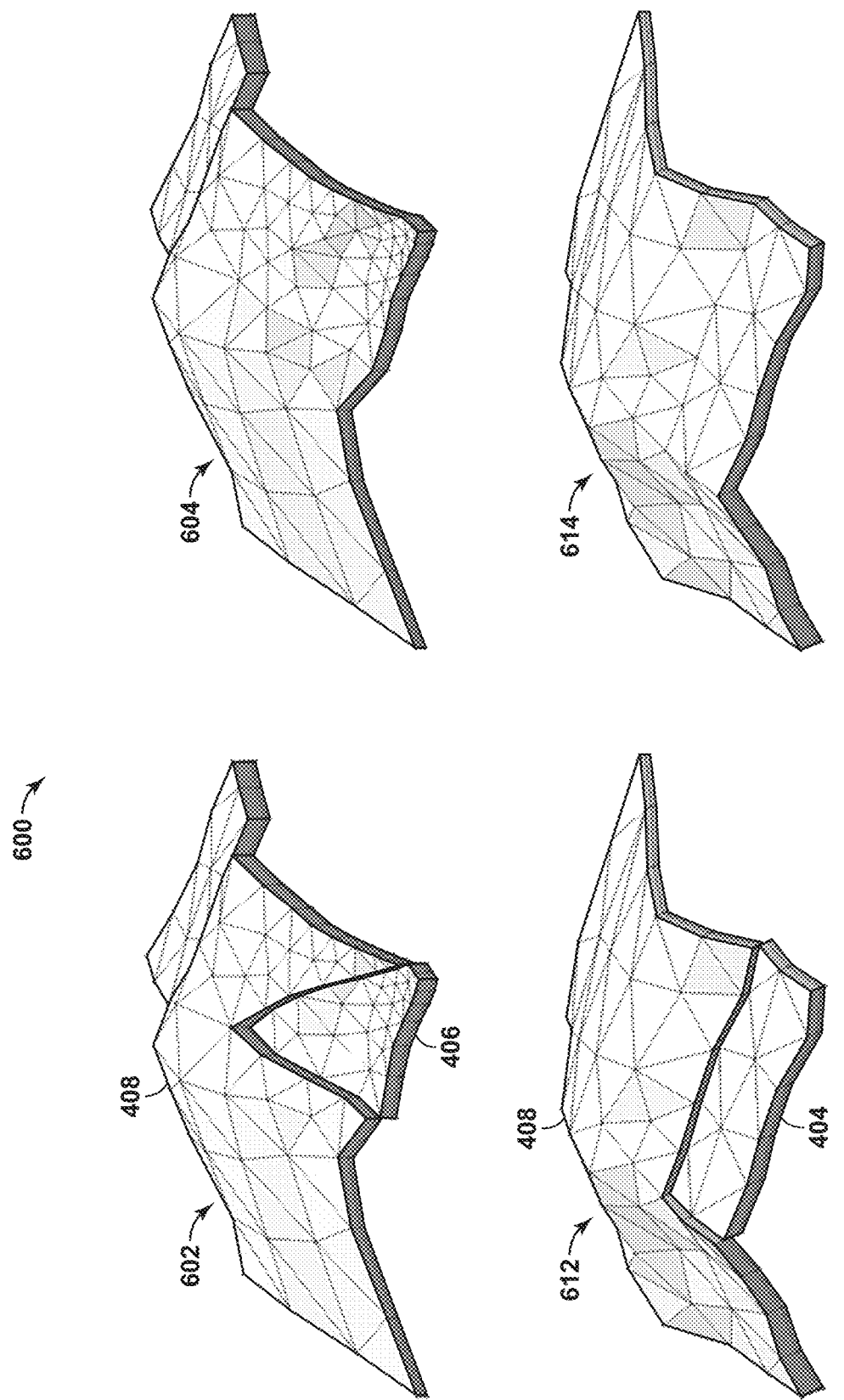
Figure 7:
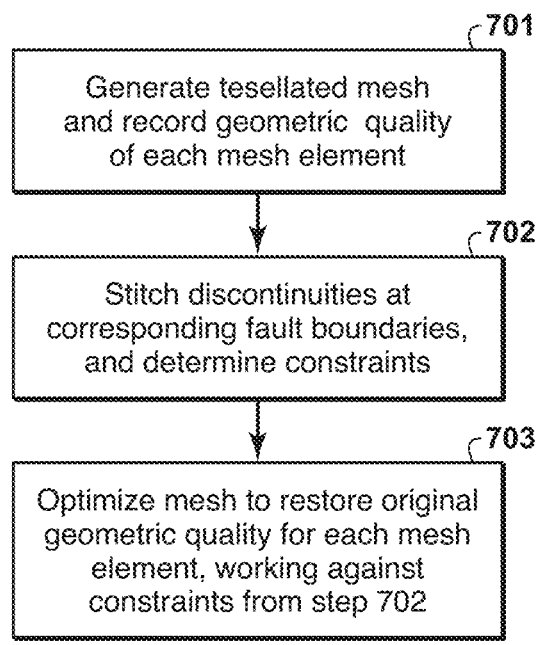
Figure 8:
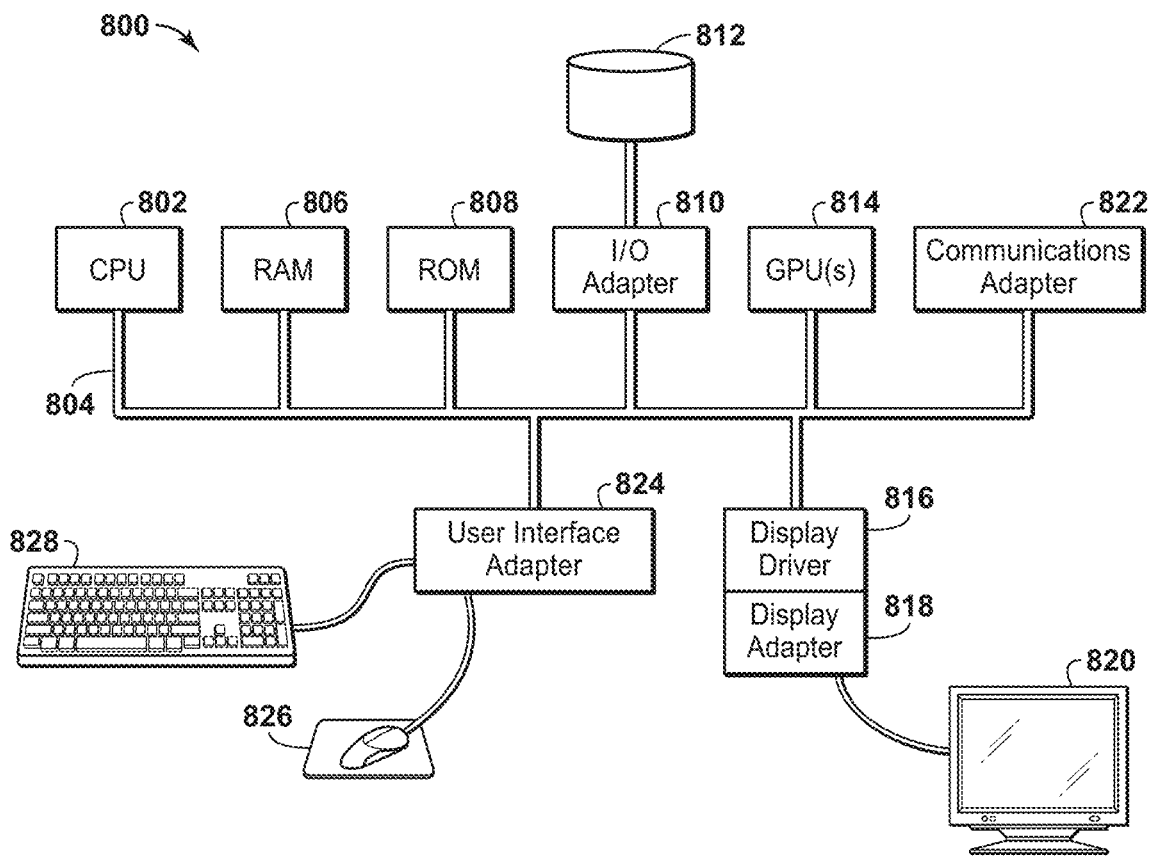

The advantages of the present invention are better understood by referring to the following detailed description and the attached drawings, in which:

FIG. 1 is a schematic diagram illustrating mapping M of a domain with discontinuities into a continuous "design space" where a "designer" defines material properties F;

FIG. 2 illustrates stitching discontinuities on a surface of a fault F, matching horizon patches A to A' and B to B', and a surface patch of F between A and B is matched to the corresponding patch of F between A' and B';

FIGS. 3A and 3B illustrate stitching discontinuities (FIG. 3A) by boundaries only (A-A', B-B') and (FIG. 3B) with internal constraints/parameterization (C and D);

FIG. 4 illustrates an example of a prismatic mesh of a faulted subsurface domain;

FIG. 5 illustrates two examples of surfaces of a subsurface domain that delineate volumes (horizons and faults), indicating correspondence of discontinuities on horizons along fault surfaces (fault traces);

FIG. 6 shows two examples of a prismatic mesh before (left) and after (right) optimization by the method of the present techniques;

FIG. 7 is a flow chart showing basic steps in one embodiment of the method of the present techniques; and FIG. 8 is a block diagram of a computer system that may be used to perform any of the methods disclosed herein.

DETAILED DESCRIPTION

In the following detailed description section, the specific embodiments of the present disclosure are described in connection with preferred embodiments. However, to the extent that the following description is specific to a particular embodiment or a particular use of the present disclosure, this is intended to be for exemplary purposes only and simply provides a description of the exemplary embodiments. Accordingly, the disclosure is not limited to the specific embodiments described below, but rather, it includes all alternatives, modifications, and equivalents falling within the true spirit and scope of the appended claims.

Various terms as used herein are defined below. To the extent a term used in a claim is not defined below, it should be given the broadest definition persons in the pertinent art have given that term as reflected in at least one printed publication or issued patent.

The articles "the", "a" and "an" are not necessarily limited to mean only one, but rather are inclusive and open ended so as to include, optionally, multiple such elements.

As used herein, the term "hydrocarbons" are generally defined as molecules formed primarily of carbon and hydrogen atoms such as oil and natural gas. Hydrocarbons may also include other elements or compounds, such as, but not limited to, halogens, metallic elements, nitrogen, oxygen, sulfur, hydrogen sulfide ($H_2S$) and carbon dioxide ($CO_2$). Hydrocarbons may be produced from hydrocarbon reservoirs through wells penetrating a hydrocarbon containing formation. Hydrocarbons derived from a hydrocarbon reservoir may include, but are not limited to, petroleum, kerogen, bitumen, pyrobitumen, asphaltenes, tars, oils, natural gas, or combinations thereof. Hydrocarbons may be located within or adjacent to mineral matrices within the earth, termed reservoirs. Matrices may include, but are not limited to, sedimentary rock, sands, silicilytes, carbonates, diatomites, and other porous media.

As used herein, "hydrocarbon exploration" refers to any activity associated with determining the locations of hydrocarbons in subsurface regions. Hydrocarbon exploration normally refers to any activity conducted to obtain measurements through acquisition of measured data associated with the subsurface formation and the associated modeling of the data to identify potential locations of hydrocarbon accumulations. Accordingly, hydrocarbon exploration includes acquiring measurement data, modeling of the measurement data to form subsurface models and determining the likely locations for hydrocarbon reservoirs within the subsurface. The acquired measurement data may include seismic, gravity, magnetic, electromagnetic and the like.

As used herein, "hydrocarbon operations", which may be referred to as which include hydrocarbon prospecting or reservoir management, refers to any activity associated with hydrocarbon exploration and/or hydrocarbon production.

As used herein, "hydrocarbon production" refers to any activity associated with extracting hydrocarbons from a well or other opening. Hydrocarbon production normally refers to any activity conducted in or on the well after the well is completed. Accordingly, hydrocarbon production or extraction includes not only primary hydrocarbon extraction but also secondary and tertiary production techniques, such as injection of gas or liquid for increasing drive pressure, mobilizing the hydrocarbon or treating by, for example chemicals or hydraulic fracturing the wellbore to promote increased flow, well servicing, well logging, and other well and wellbore treatments.

The present techniques include a method that can utilize any finite-element mesh with edges that do not cross horizon or fault surfaces (can be conformal to the surface or can have two different approximations of the surface from either side of the surface). A mapping to a design space is found as a result of solving a grid optimization problem, which is a simpler formulation than a physics-based restoration problem, is fully defined based on the geometry and topology of the supporting mesh (no special treatment for different types of surfaces), and minimizes volumetric distortion of the mapping. The mapping can be used to build a subsurface physical property model, which can then be used for hydrocarbon prospecting or reservoir development. One example is patent application U.S. Ser. No. 62/031,097, entitled "Volumetric grid generation in a domain with heterogeneous material properties," which is incorporated by reference herein in all jurisdictions that allow it. Another related application is U.S. Patent Application Publication No. 2013/0246031, entitled "Methods to Handle Discontinuity in Constructing Design Space Using Moving Least Squares," which is also incorporated by reference herein in all jurisdictions that allow it.

In one embodiment, the present techniques includes a method for generating a model of a material property of a faulted subsurface region for hydrocarbon prospecting or reservoir development, said method comprising: (a) generating, using a computer, a mapping of a model mesh representing a physical domain of the subsurface region, with faults, to an optimized mesh representing a continuous design space in which all faults are removed, said mapping being designed to minimize deformation in mesh cells; (b) assigning values of the material property to continuous volumes in the optimized mesh to generate a model of the material property in the design space, and using that to generate a model of the material property in the faulted physical domain; and (c) using the model of the material property in the faulted physical domain for hydrocarbon prospecting or reservoir development in the subsurface region.

Beneficially, the present techniques address the problem of "design space" construction as a mesh optimization problem. The mapping of a point P to or from design space is fully defined from the coordinates of mesh vertices before (physical space) and after optimization (design space), the location of point P in the mesh (which cell it belongs to), and the local geometric basis of that cell (e.g., piece-wise linear interpolation between the vertices of a tetrahedron).

In this approach, the mathematical formulation of the problem of computing the mapping is not physics-based, but geometry-based. It strives to minimize deformation of each individual mesh cell while imposing constraints on the discontinuities (they need to be "stitched" together). Thus, minimal distortion in the volumetric domain pieces is achieved without being constrained by physics-based deformation or restoration rules.

In a physics-based approach, it is necessary to establish boundary conditions that bring domain pieces together. That requires identifying correspondence of the boundaries, followed by imposing a physical condition, e.g. introduction of springs that insures minimal energy at the configuration when the boundaries are stitched. In the geometric approach disclosed herein, only geometric correspondence of the boundaries is utilized. Stitching them together becomes a part of grid optimization formulation through constraint or penalty terms on an optimization problem. Therefore, the combination of establishing correspondence between the boundaries of discontinuities and imposing optimization constraints may be referred to as "stitching" those discontinuities.

One aspect of the present techniques involves defining the stitching approach (e.g., boundary correspondence of discontinuous volumes in terms of geometric constraints on the grid optimization problem). The present techniques may be further understood with reference to FIGS. 1 to 8, which are described further below.

FIG. 1 is a schematic diagram 100 illustrating a mapping M of objects from the physical space 104 to the design space 106. In this diagram 100, various objects, such as objects 110, 112 and 114 form a discontinuous volume in the physical space 104. The mapping M is utilized to form a continuous volume of objects 110', 112' and 114' in the design space 106, which are associated with the objects 110, 112 and 114 in the physical space 104. As part of this mapping, the point 116 having coordinates (x, y, z) in the physical space may be mapped to the point 116' in the design space. In the design space, material properties may be defined for the objects 110', 112' and 114'. These material properties may be defined by a user. The material properties may include permeability, porosity, and density.

In one embodiment, basic steps in the present techniques for generation of a mapping from the original model domain to its design space may be summarized, with reference to the flow chart of FIG. 7, as follows.

Step 701: Generate tessellation of the model, and record the geometric quality of each mesh element. For example, each mesh element in a 3-D grid may be a tetrahedron, and this geometrical classification is considered the quality of the mesh element or cell for purposes of this disclosure. A variety of known techniques exist for tetrahedral mesh generation in a volumetric domain (e.g., Delaunay tetrahedrization, or advancing front methods). Any of them can be used in the present techniques. However, the present techniques are not limited to tetrahedral grids—any finite-element grid, even hybrid of several element types such as prisms and tetrahedral, can be utilized. To facilitate the mapping process, it is preferable that the initial grid be cut or non-conforming across discontinuities (which can always be achieved by mirroring grid faces on the discontinuities if the generated grid was conforming).

Step 702: Stich discontinuities at corresponding fault boundaries, and determine constraints. The stitch discontinuities may be performed by establishing correspondence of the boundaries of the surface patches (n–1) dimension (D) representing the discontinuities, and construct constraints. The boundaries of discontinuities are straightforward to determine and match (need to match two discretized (n–2) D patches—usually means matching two independent curves which can be done by matching their independent parameterizations). In the subsurface modeling application, this is matching fault traces of each horizon (intersections between fault surface and horizon surface patches) from both sides of the fault.

After the boundaries are matched, the entire discontinuity surface may be matched approximately. However, if the surface of discontinuity is too curved, stitching only its boundaries may not be enough to achieve good match of the entire surface. In this case, "parameterization" of the discontinuity patches can be introduced, and stitching can be defined for each parametric line, thus forcing surface match along those lines. As an example, FIG. 2 is a diagram 200 of stitching discontinuities on a surface of a fault F, matching horizon patches A to A' and B to B', and a surface patch of F between A and B is matched to the corresponding patch of F' between A' and B'. FIG. 3A is a diagram 300 of stitching discontinuities by boundaries only (A-A', B-B'), while FIG. 3B is a diagram 320 of stitching with internal constraints and parameterization (C-C' and D-D'). The dashed curve is the actual discontinuity surface. Introducing two parametric lines C and D, and stitching also along those lines produces a better match to the actual discontinuity surface.

Correspondence of the boundaries leads to formulation of the constraints for the grid optimization problem. Lagrange multiplier formulation may be used to achieve exact stitching. As an option (e.g., for the case where the scale of discontinuities is significant relative to the model size), optimization can be started with a penalty term for constraints, followed by a switch to Lagrange multipliers at the end. Alternatively, the process can begin by relocating nodes on discontinuities to actually stitch them, followed by the use of multipliers during optimization to keep them stitched. The constraints may not be applied until step 703, but constraints may be constructed as soon as the points to be stitched together are identified, which is in step 702.

Step 703: Optimize mesh to restore original geometric quality for each mesh element, working against constraints from step 702. This may involve performing a mesh optimization procedure aiming at restoring original geometric quality for each cell in the mesh, and impose the constraints formulation of the previous step. For example, one can use grid optimization techniques in step 701, where a global grid quality measure may be computed by adding together quality metrics computed on every cell in the mesh. The global cell quality measure can have an adjustment to penalize worst quality cells (inside-out or zero-volume cells). This global quality measure may be optimized under free movement of mesh nodes. An individual cell quality metric may be chosen to combine a shape quality indicator with a size metric using a weight $0 \le \theta \le 1$. The cell quality metric can be represented in a universal way for all types of cells through the Jacobian S of the mapping from a canonical finite-element shape (e.g., a mapping from a unit square to a general quadrilateral cell). Furthermore, the use of the Jacobians allows superimposing multiple mappings and, thus, using a target cell shape and a size definition different from a canonical shape. In the present case, individual cell Jacobians H and quality metrics of the original mesh of step 701 may be computed, and then cell quality metrics can be written in n-dimensions as $$E_\theta(F) = (1-\theta)\frac{\left(\frac{1}{n}trF^TF\right)^{\frac{n}{2}}}{\det F} + \frac{1}{2}\left(\frac{1}{\det F} + \det F\right),$$

where $F = SH^{-1}$.

H is a Jacobian for mapping to the target cell (n×n matrix), S is a Jacobian for the current cell (n×n matrix), θ is a weight in combination of shape and size metrics, tr is the trace of a matrix defined as a sum of its diagonal entries, e.g., for n=3, a 3×3 matrix $$\text{matrix} = \begin{matrix} s11 & s12 & s13 \\ s21 & s22 & s23, \\ s31 & s32 & s33 \end{matrix}$$

and trS=s11+s22+s33, det is the determinant of a matrix, and detS=s11(s22s33−s23s32)−s12(s21s33−s23s31)+s13 (s21s32−s22s31).

The problem of optimization of the global mesh quality measure is then posed as a problem for finding coordinates of all nodes in the mesh $R^T=(X_1^T, \ldots, X_n^T)$ that satisfy $$R = \text{argmin}_R \sum_{cell=1}^{Ncells} \sum_{q(cell)=1}^{M} \sigma_{q(cell)} E_\theta(SH^{-1}|_{q(cell)})$$

where q(cell) are quadrature locations inside each cell, $\sigma_{q(cell)} \geq 0$ are corresponding quadrature weights satisfying $\Sigma_{q(cell)=1}^{M} \sigma_{q(cell)} = 1$, and Jacobians S at those locations can be expressed as functions of mesh node coordinates R. In the present case, without imposing any constraints, a solution to the optimization problem above is the original mesh of a discontinuous domain. Thus, changes in the mesh may be achieved through introduction of stitching constraints that force mesh nodes to redistribute.

The method outlined in FIG. 7 handles all discontinuities at once, so there is no need to develop a mechanism for ordering discontinuities as long as their correspondence is established. This method effectively minimizes deformation of the individual mesh elements from their original state under the global influence of mesh connectivity. The resulting mesh describes the continuous design space, and the mapping can be evaluated both ways as piece-wise continuous on the mesh elements. (Note that resulting mesh is not necessarily conformable at the stitches, but this has no implication on evaluation of the two-way mapping. If preferred, post-processing can be performed to make the resulting mesh conformable by subdividing elements' neighboring stitches.

In general, it may be expected that imposing constraints of step 702 may introduce high deformations to the mesh elements near discontinuities and can lead to inverted (negative volume) elements. Thus, the grid optimization method in step 703 has to be capable of mesh untangling as well as of optimizing each element quality based on the targets, and lend itself to a constrained formulation.

There are several ways constraints can be imposed on the grid optimization method described in step 703). For example, three different ways that step 703 can be performed are as follows:

Constrained Optimization Using Lagrange Multipliers

A constraint may be defined for each pair of points (i1, i2) that were identified in step 702 as the two points that should be stitched together and be co-located to remove the discontinuity, where the constraint may be expressed in the form $g_i(R)=X_k(i1)-X_k(i2)$, k=1, ..., n. The grid optimization problem now transforms into minimization of the Lagrangian functional where all $N_{constr}$ constraints (with weights $\lambda_i$) are added to the original grid quality measure:

$$R = \text{argmin}_R \left\{ \sum_{cell=1}^{Ncells} \sum_{q(cell)=1}^{M} \sigma_{q(cell)} E_\theta(SH^{-1}|_{q(cell)}) + \sum_{i=1}^{Nconstr} \lambda_i g_i(R) \right\}$$

The numerical solution procedure is similar to solution strategy for the original minimization problem as described in reference Branets, which is incorporated by reference herein in all jurisdictions that allow it. See e.g., L. Branets, "A variational grid optimization method based on a local cell quality metric," PhD Thesis, University of Texas at Austin (2005). In this thesis, the method is not applied to unfaulting, and the thesis does not disclose certain features that are disclosed herein, including: the technique for stitching discontinuities at fault boundaries and constructing constraints for the optimization.

Adding Constraints as Penalty Terms

A constraint may be defined for each pair of points (i1, i2) that were identified in step 702 as two points that should be stitched together and be co-located to remove the discontinuity, where the constraint may be expressed in the form $g_i(R)=\frac{1}{2}(X_k(i1)-X_k(i2))^2$, k=1, ..., n. The grid quality measure now has an extra penalty term for the constraints, where ε is a small number related to the geometric tolerance at which two points can be considered the same, as noted in the following equation:

$$R = \text{argmin}_R \left\{ \sum_{cell=1}^{Ncells} \sum_{q(cell)=1}^{M} \sigma_{q(cell)} E_\theta(SH^{-1}|_{q(cell)}) + \sum_{i=1}^{Nconstr} \frac{g_i(R)}{\varepsilon} \right\}$$

The numerical solution procedure is very similar to solution strategy for the unconstrained minimization problem. Optionally, this workflow can be followed by Lagrange multiplier approach to achieve even tighter stitching.

Node Relocation

In this alternative, the original mesh of the discontinuous domain may be modified by relocating both nodes in each pair of points (i1, i2) that were identified in step 702 as the two points that should be stitched together to their average position X(i1), $$X(i2) \to \frac{X(i1)+X(i2)}{2}.$$

Then, either those nodes may be maintained as fixed and the unconstrained grid optimization is run to restore grid cell shapes, or all nodes remain flexible and either of the two constrained approaches above may be used to keep them together during constrained grid optimization. The nodes are grid or mesh locations, while points are locations within the space.

Note that for convenience, in the description, above it was assumed that both of the points to be stitched together are actual mesh nodes (where a node is an intersection of two or more cell edges). However, all the formulas and algorithms easily generalize to the case where those stitching points belong to faces of the mesh cells and their coordinates can be expressed as linear combination of several mesh nodes, which may be used when additional "parameterization" is introduced in step 702).

Example Application: Geologic Modeling

In an example application to geologic modeling, the present techniques can be applied as follows:

(1) Build a general finite-element mesh in the volumes of the physical space of the model which are delineated by faults and horizons, and record geometric quality of each cell. This is illustrated in FIG. 4 where a prismatic mesh has been chosen. FIG. 4 is a diagram 400 of an exemplary prismatic mesh 402 of a faulted subsurface domain. The diagram 400 has three volumetric pieces 404, 406 and 408, which form a discontinuous volume.

(2) Establish correspondence between fault traces of the same horizon and stitch them together by one or more of the following types of constraints: a) penalty+Lagrange multipliers, b) relocating mesh nodes from both traces to the average location for the trace+Lagrange multipliers, c) Lagrange multipliers only. FIG. 5 is a diagram 500 of two horizon views 510 and 520 and shows different examples in which the correspondence of the top horizon's discontinuities due to a fault are indicated, as shown by fault surface 512 and 522. These are two different views 510 and 520 of the model, which consists of three fault blocks: a large central block 408, a triangular-shaped block 406, and a rectangular-shaped block 404. Two faults are separating each of the smaller fault blocks from the central one. FIG. 5 at top shows the triangular fault block, which can be seen to be separated from central block 508 by two different faults; on the bottom, FIG. 5 shows the rectangular fault block, which is also separated from the central block by two different faults. The darker shaded portions in FIG. 5 are the bottom horizon of the model.

(3) Run a mesh optimization procedure aiming at restoring original geometric quality for each cell, imposing the constraints found in the previous step. FIG. 6 is a diagram 600 of horizon views 602, 604, 612 and 614. In the horizon views 602, 604, 612 and 614, the two examples of a prismatic mesh before optimization by the present techniques, as shown in horizon views 602 and 612, and after optimization by the present techniques, as shown in horizon views 604 and 614. Accordingly, the adjustments from the horizon views 602 and 612 to the horizon views 604 and 614 is provided by the mapping from the faulted, physical domain to a continuous design space.

The enhanced subsurface model from the present techniques may be used to enhance hydrocarbon operations, such as hydrocarbon exploration and hydrocarbon production. For example, the hydrocarbon exploration operations involve any activity associated with determining the locations of hydrocarbons in subsurface regions. Hydrocarbon exploration involves activities conducted to obtain measurements through acquisitions of measured data associated with the subsurface formation and the associated modeling of the data to identify potential locations of hydrocarbon accumulations. Accordingly, hydrocarbon exploration includes acquiring measurement data, modeling of the measurement data to form subsurface models and determining the likely locations for hydrocarbon reservoirs within the subsurface. The measurement data may include seismic, gravity, magnetic, electromagnetic and the like.

Further, hydrocarbon production operations involve any activity associated with extracting hydrocarbons from a well or other opening. Hydrocarbon production involve activities conducted to form the well along with activities in or on the well after the well is completed. Accordingly, hydrocarbon production or extraction includes not only primary hydrocarbon extraction but also secondary and tertiary production techniques, such as injection of gas or liquid for increasing drive pressure, mobilizing the hydrocarbon or treating by, for example chemicals or hydraulic fracturing the wellbore to promote increased flow, well servicing, well logging, and other well and wellbore treatments.

The hydrocarbon operations are used to develop strategies. The strategies may be used to explore for hydrocarbons and/or to produce hydrocarbons. That is, based on the comparison, drilling of a well may be performed to provide access to the hydrocarbon accumulation. Further, the production may include installing or modifying a production facility for the production of hydrocarbons from the production intervals that provide access to the hydrocarbons in the subsurface formation. The production facility may include one or more units to process and manage the flow of production fluids, such as hydrocarbons and/or water, from the formation. To access the production intervals, the production facility may be coupled to a tree and various control valves via a control umbilical, production tubing for passing fluids from the tree to the production facility, control tubing for hydraulic or electrical devices, and a control cable for communicating with other devices within the wellbore. The strategy may adjust the well locations, fracture depths and patterns, etc.

Beneficially, this method provides an enhancement in the production and exploration of hydrocarbons. In particular, the method may be utilized to enhance hydrocarbon exploration and hydrocarbon production operations.

Persons skilled in the technical field will readily recognize that in practical applications of the disclosed methodology, it is partially performed on a computer, typically a suitably programmed digital computer. Further, some portions of the detailed descriptions which follow are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "processing" or "computing", "calculating", "comparing", "determining", "displaying", "copying," "producing," "storing," "adding," "applying," "executing," "maintaining," "updating," "creating," "constructing" "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present techniques also relate to an apparatus for performing the operations herein. This apparatus may be specially constructed for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.), and a machine (e.g., computer) readable transmission medium (electrical, optical, acoustical or other form of propagated signals (e.g., carrier waves, infrared signals, digital signals, etc.)).

Furthermore, as will be apparent to one of ordinary skill in the relevant art, the modules, features, attributes, methodologies, and other aspects of the invention can be implemented as software, hardware, firmware or any combination of the three. Of course, wherever a component of the present invention is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming Additionally, the present invention is in no way limited to implementation in any specific operating system or environment.

Further, one or more embodiments may include methods that are performed by executing one or more sets of instructions to perform modeling enhancements in various stages. For example, the method may include executing one or more sets of instructions to perform comparisons between thresholds current statuses or indications along with transmitting data between modules, components and/or sensors.

As an example, a computer system may be utilized and configured to implement on or more of the present aspects. The computer system may include a processor; memory in communication with the processor; and a set of instructions stored on the memory and accessible by the processor, wherein the set of instructions, when executed, are configured to: generate a mapping of a model mesh representing a physical domain of the subsurface region, with faults, to an optimized mesh representing a continuous design space in which all faults are removed, said mapping being designed to minimize deformation in mesh cells; assign values of the material property to continuous volumes in the optimized mesh to generate a model of the material property in the design space, and using that model to generate a model of the material property in the faulted physical domain; and provide, store or display the model of the material property in the faulted physical domain for hydrocarbon prospecting or reservoir development in the subsurface region. Further, the set of instructions for minimizing deformation in mesh cells may be configured to: generate a tessellated mesh dividing the physical domain into cells, and recording geometric quality of each cell; design stitching constraints to stitch together discontinuities at fault boundaries, or alternatively stitching discontinuities by node relocation, thereby truncating cells at fault boundaries; and optimize the mesh in an iterative optimization procedure, subject to the stitching constraints, with the optimization aimed at minimizing degradation in geometric quality from the recorded geometric quality due to the stitching constraints, wherein all mesh nodes are free to move, or all mesh nodes are free to move except mesh nodes associated with the stitching together of discontinuities at fault boundaries, which mesh nodes are relocated to an average position and held fixed there. Also, the set of instructions may be configured to adjust locations of mesh nodes under influence of the constraints; penalize worst quality cells based on a global grid quality measure computed by adding together quality metrics computed on cells in the mesh; compute quality metrics on every cell in the mesh are based on combining a shape quality indicator with a size metric; determine shape quality indicator based on a Jacobian of a mapping from a unit square to a general quadrilateral cell; generate cells in the generated tessellated mesh having edges that do not cross horizon or fault surfaces; stitch boundary points on a surface of discontinuity; parameterize the surface of discontinuity and stitching pairs of points intermediate between said boundary points; stitch constraints are based on minimizing distance between two points, on opposite sides of a fault boundary, to be stitched together, said two points having been determined to be co-located before the fault occurred; stitch constraints by including, in a cost or objective function that is being minimized in the optimization, a term containing an expression for said distance between two points to be stitched together, expressed with a Lagrange multiplier or as a penalty term and/or generate tessellated mesh is cut or non-conforming across discontinuities.

As an example, FIG. 8 is a block diagram of a computer system 800 that may be used to perform any of the methods disclosed herein. A central processing unit (CPU) 802 is coupled to system bus 804. The CPU 802 may be any general-purpose CPU, although other types of architectures of CPU 802 (or other components of exemplary system 800) may be used as long as CPU 802 (and other components of system 800) supports the present techniques as described herein. The CPU 802 may execute the various logical instructions according to disclosed aspects and methodologies. For example, the CPU 802 may execute machine-level instructions for performing processing according to aspects and methodologies disclosed herein.

The computer system 800 may also include computer components such as a random access memory (RAM) 806, which may be SRAM, DRAM, SDRAM, or the like. The computer system 800 may also include read-only memory (ROM) 808, which may be PROM, EPROM, EEPROM, or the like. RAM 806 and ROM 808 hold user and system data and programs, as is known in the art. The computer system 800 may also include an input/output (I/O) adapter 810, a communications adapter 822, a user interface adapter 824, and a display adapter 818. The I/O adapter 810, the user interface adapter 824, and/or communications adapter 822 may, in certain aspects and techniques, enable a user to interact with computer system 800 to input information.

The I/O adapter 810 preferably connects a storage device(s) 812, such as one or more of hard drive, compact disc (CD) drive, floppy disk drive, tape drive, etc. to computer system 800. The storage device(s) may be used when RAM 806 is insufficient for the memory requirements associated with storing data for operations of embodiments of the present techniques. The data storage of the computer system 800 may be used for storing information and/or other data used or generated as disclosed herein. The communications adapter 822 may couple the computer system 800 to a network (not shown), which may enable information to be input to and/or output from system 800 via the network (for example, a wide-area network, a local-area network, a wireless network, any combination of the foregoing). User interface adapter 824 couples user input devices, such as a keyboard 828, a pointing device 826, and the like, to computer system 800. The display adapter 818 is driven by the CPU 802 to control, through a display driver 816, the display on a display device 820. Information and/or representations of one or more 2D canvases and one or more 3D windows may be displayed, according to disclosed aspects and methodologies.

The architecture of system 800 may be varied as desired. For example, any suitable processor-based device may be used, including without limitation personal computers, laptop computers, computer workstations, and multi-processor servers. Moreover, embodiments may be implemented on application specific integrated circuits (ASICs) or very large scale integrated (VLSI) circuits. In fact, persons of ordinary skill in the art may use any number of suitable structures capable of executing logical operations according to the embodiments.

In one or more embodiments, the method may be implemented in machine-readable logic, such that a set of instructions or code that, when executed, performs operations from memory.

It should be understood that the preceding is merely a detailed description of specific embodiments of the invention and that numerous changes, modifications, and alternatives to the disclosed embodiments can be made in accordance with the disclosure here without departing from the scope of the invention. The preceding description, therefore, is not meant to limit the scope of the invention. Rather, the scope of the invention is to be determined only by the appended claims and their equivalents. It is also contemplated that structures and features embodied in the present examples can be altered, rearranged, substituted, deleted, duplicated, combined, or added to each other.

The foregoing description is directed to particular embodiments of the present invention for the purpose of illustrating it. It will be apparent, however, to one skilled in the art, that many modifications and variations to the embodiments described herein are possible. All such modifications and variations are intended to be within the scope of the present invention, as defined by the appended claims.

What is claimed is:

1. A method for generating a model of a material property of a faulted subsurface region for hydrocarbon prospecting or reservoir development, said method comprising:
    generating, using a computer, a mapping of a model mesh representing physical features of the subsurface region, with faults, to an optimized mesh representing a continuous design space in which all faults are removed, said mapping being designed to minimize deformation in mesh cells, wherein minimizing deformation in the mesh cells comprises:
        generating a tessellated mesh dividing the physical domain into cells and recording geometric quality of each cell;
        designing stitching constraints to stitch together discontinuities at fault boundaries or alternatively stitching discontinuities by node relocation, thereby truncating cells at fault boundaries; and
        optimizing the mesh representing the continuous design space in an iterative optimization procedure, wherein optimizing comprises computing a global grid quality measure by adding together quality metrics computed on every cell in the mesh, wherein the quality metrics computed on every cell in the mesh are based on combining a shape quality indicator with a size metric, subject to the stitching constraints, and wherein the optimization minimizes degradation in geometric quality from the recorded geometric quality due to the stitching constraints, and wherein all mesh nodes are free to move or all mesh modes are free to move except mesh nodes associated with the stitching together of discontinuities at fault boundaries, which mesh nodes are relocated to an average position and held fixed there;
    assigning values of the material property to continuous volumes in the optimized mesh to generate a model of the material property in the design space, and using that to generate a model of the material property in the faulted physical domain; and
    using the model of the material property in the faulted physical domain for hydrocarbon exploration or hydrocarbon production activities in the subsurface region.

2. The method of claim 1, wherein the mesh is optimized to adjust locations of mesh nodes under influence of the constraints.

3. The method of claim 1, wherein the optimization procedure penalizes worst quality cells based on a global grid quality measure computed by adding together quality metrics computed on cells in the mesh.

4. The method of claim 1, wherein the shape quality indicator is based on a Jacobian of a mapping from a unit square to a general quadrilateral cell.

5. The method of claim 1, wherein all cells in the generated tessellated mesh have edges that do not cross horizon or fault surfaces.

6. The method of claim 1, wherein stitching discontinuities at fault boundaries includes stitching boundary points on a surface of discontinuity.

7. The method of claim 6, wherein stitching discontinuities at fault boundaries further includes parameterizing the surface of discontinuity and stitching pairs of points intermediate between said boundary points.

8. The method of claim 1, wherein the stitching constraints are based on minimizing distance between two points, on opposite sides of a fault boundary, to be stitched together, said two points having been determined to be co-located before the fault occurred.

9. The method of claim 8, wherein the stitching constraints are imposed by including, in a cost or objective function that is being minimized in the optimization, a term containing an expression for said distance between two points to be stitched together, expressed with a Lagrange multiplier or as a penalty term.

10. The method of claim 1, wherein the generated tessellated mesh is cut or non-conforming across discontinuities.

\* \* \* \* \*